United States Patent
Huang et al.

(10) Patent No.: US 10,947,412 B2
(45) Date of Patent: Mar. 16, 2021

(54) CRACK-RESISTANT SILICON-BASED PLANARIZING COMPOSITIONS, METHODS AND FILMS

(71) Applicant: Honeywell International Inc., Morris Plains, NJ (US)

(72) Inventors: Hong Min Huang, Shanghai (CN); Helen Xiao Xu, Sunnyvale, CA (US)

(73) Assignee: Honeywell International Inc., Charlotte, NC (US)

( * ) Notice: Subject to any disclaimer, the term of this patent is extended or adjusted under 35 U.S.C. 154(b) by 101 days.

(21) Appl. No.: 16/210,153

(22) Filed: Dec. 5, 2018

(65) Prior Publication Data
US 2019/0185708 A1    Jun. 20, 2019

Related U.S. Application Data

(60) Provisional application No. 62/607,454, filed on Dec. 19, 2017.

(51) Int. Cl.
*C09D 183/10* (2006.01)
*C09D 7/63* (2018.01)
(Continued)

(52) U.S. Cl.
CPC ............. *C09D 183/10* (2013.01); *C09D 7/63* (2018.01); *C09D 7/65* (2018.01); *C09D 7/80* (2018.01);
(Continued)

(58) Field of Classification Search
None
See application file for complete search history.

(56) References Cited

U.S. PATENT DOCUMENTS 5,152,834 A * 10/1992 Allman .................. C08G 77/06
                                                      106/287.13
5,286,572 A *  2/1994 Clodgo ............... H01L 21/3122
                                                         428/447
(Continued)

FOREIGN PATENT DOCUMENTS

CN    104262628 B    8/2016
CN    106062042 A   10/2016
(Continued)

OTHER PUBLICATIONS

International Search Report and Written Opinion received for PCT Patent Application No. PCT/US2018/066139, dated May 10, 2019, 8 pages.

*Primary Examiner* — Robert S Loewe
(74) *Attorney, Agent, or Firm* — Faegre Drinker Biddle & Reath LLP

(57) ABSTRACT

A composition for planarizing a semiconductor device surface includes a silicon-based material and a cross-linker including a siloxane compound according to the general formula:

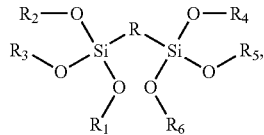

wherein R is an aliphatic comprising group and $R_1$, $R_2$, $R_3$, $R_4$, $R_5$, and $R_6$ are each independently selected from the group consisting of: H or an alkyl group with substituted or unsubstituted carbons.

16 Claims, 2 Drawing Sheets

(51) Int. Cl.
  *C09D 7/65* (2018.01)
  *H01L 21/3105* (2006.01)
  *C09D 7/80* (2018.01)
  *C09G 1/16* (2006.01)
  *C08K 5/19* (2006.01)
  *C08L 83/08* (2006.01)
(52) U.S. Cl.
  CPC .......... *C09G 1/16* (2013.01); *H01L 21/31051* (2013.01); *C08K 5/19* (2013.01); *C08L 83/08* (2013.01)

(56) References Cited

U.S. PATENT DOCUMENTS

| | | | |
|---|---|---|---|
| 5,412,053 A * | 5/1995 | Lichtenhan | C08G 77/04 528/25 |
| 6,251,486 B1 | 6/2001 | Chandross et al. | |
| 6,410,151 B1 * | 6/2002 | Kurosawa | H01L 21/02216 428/447 |
| 6,495,264 B2 * | 12/2002 | Hayashi | C08G 77/08 428/447 |
| 6,503,633 B2 * | 1/2003 | Nishikawa | H01L 21/02216 428/447 |
| 7,820,769 B2 | 10/2010 | Seifalian et al. | |
| 7,893,538 B2 * | 2/2011 | Nakagawa | H01L 21/02126 257/759 |
| 8,404,786 B2 * | 3/2013 | Akiyama | H01L 21/02348 525/477 |
| 8,519,079 B2 * | 8/2013 | Maliverney | C08K 5/31 528/21 |
| 8,901,268 B2 | 12/2014 | Krishnamoorthy et al. | |
| 2002/0189495 A1 | 12/2002 | Hayashi et al. | |
| 2005/0096415 A1 * | 5/2005 | Akiyama | C09D 183/04 524/261 |
| 2006/0024980 A1 | 2/2006 | Tsuchiya et al. | |
| 2007/0051947 A1 * | 3/2007 | Nakayama | H01L 51/0074 257/40 |
| 2008/0012074 A1 | 1/2008 | Braymer et al. | |
| 2008/0287573 A1 * | 11/2008 | Rhee | H01L 21/31695 524/27 |
| 2009/0218592 A1 * | 9/2009 | Hawker | C08G 77/08 257/100 |
| 2010/0006843 A1 | 1/2010 | Lee et al. | |
| 2011/0048787 A1 | 3/2011 | Allen et al. | |
| 2011/0201827 A1 | 8/2011 | Lichtenhan et al. | |
| 2013/0012645 A1 * | 1/2013 | Lucas | C04B 41/4966 524/500 |
| 2014/0342292 A1 * | 11/2014 | Fu | C09D 183/04 430/325 |
| 2014/0356620 A1 * | 12/2014 | Rathore | C08K 5/057 428/354 |
| 2015/0232489 A1 * | 8/2015 | Wong Chi Man | C07F 7/1804 552/4 |
| 2015/0353774 A1 * | 12/2015 | Simon | C09D 7/62 427/387 |
| 2017/0260419 A1 | 9/2017 | Iwamoto et al. | |

FOREIGN PATENT DOCUMENTS

| | | |
|---|---|---|
| JP | 2015155541 A | 8/2015 |
| KR | 2011074677 A | 7/2011 |
| WO | WO2016167892 A1 | 10/2016 |

\* cited by examiner

CRACK-RESISTANT SILICON-BASED PLANARIZING COMPOSITIONS, METHODS AND FILMS

CROSS-REFERENCE TO RELATED APPLICATION

This application claims priority to U.S. Provisional Application No. 62/607,454, filed Dec. 19, 2017, which is herein incorporated by reference in its entirety.

FIELD

The present invention relates to planarizing materials, and in particular, to planarizing dielectric materials for semiconductor and display manufacturing.

BACKGROUND

In advanced semiconductor manufacturing, for example microprocessors, memory devices, and displays employing light emitting diodes, there is a need for dielectric materials which can be spin-coated onto a surface of a device to fill deep spaces or gaps between device structures to provide a relatively planar surface suitable for subsequent device layer processing.

Improvements in planarizing dielectric materials are desired to provide planarization for advanced semiconductor devices having trenches six microns deep or deeper. It is important that such dielectric materials be crack resistant at such thicknesses, even when exposed to temperatures in excess of 400° C. It is also important for optoelectronic applications that such dielectric materials have a high optical transmittance. The dielectric materials should also be thermally stable when exposed to temperatures exceeding 400° C.

SUMMARY

A composition for planarizing a semiconductor device surface includes a silicon-based material and a cross-linker including a siloxane compound according to the general formula:

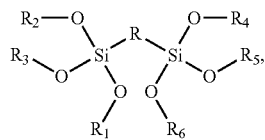

wherein R is an aliphatic comprising group and $R_1$, $R_2$, $R_3$, $R_4$, $R_5$, and $R_6$ are each independently selected from the group consisting of: H or an alkyl group with substituted or unsubstituted carbons.

Various embodiments concern a composition for planarizing a semiconductor device. The composition includes a silicon-based material, at least one solvent, a catalyst, and a cross-linker. The silicon based-material includes at least one of: a siloxane, a silsesquioxane, a polysiloxane, a polysilsesquioxane, and a polysiloxane resin. The cross-linker includes a siloxane compound according to the general formula:

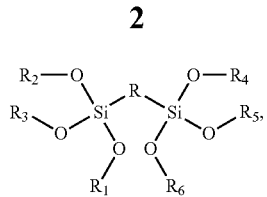

wherein R is an aliphatic comprising group and $R_1$, $R_2$, $R_3$, $R_4$, $R_5$, and $R_6$ are each independently selected from the group consisting of: H or an alkyl group with substituted or unsubstituted carbons. In some embodiments, the cross-linker includes at least one of: bis-(trimethoxysilylpropyl) amine, bis(triethoxysilyl) methane, 1,2-bis(triethoxysilyl) ethane and 1-(triethoxysilyl)-2-(diethoxymethylsilyl) ethane. In some further embodiments, the cross-linker consists of bis-(trimethoxysilylpropyl) amine. In some embodiments, the silicon-based material includes a polysiloxane resin formed from monomers including at least one of: methyltrimethoxysilane, methyltriethoxysilane, dimethyldiethoxysilane, phenyl triethoxysilane, dimethyldimethoxysilane, and phenyl trimethoxysilane. In some further embodiments, the polysiloxane resin is formed from monomers consisting of methyltriethoxysilane, dimethyldiethoxysilane, and phenyl triethoxysilane. In some embodiments, a concentration of the cross-linker is from 0.1 weight percent to 5 weight percent of the composition. In some embodiments, the at least one solvent includes at least one of: ethyl lactate, propylene glycol propyl ether, propylene glycol monomethyl ether acetate, ethanol, isopropyl alcohol, and n-butyl acetate. In some embodiments, the catalyst includes at least one of: tetramethylammonium acetate, tetramethylammonium hydroxide, tetrabutylammonium acetate, cetyltrimethylammonium acetate, and tetramethylammonium nitrate. In some embodiments, the composition further includes a surfactant.

Various embodiments concern a method for making a planarizing composition. The method includes dissolving a silicon-based material in one or more solvents to form a silicon-based material solution, adding a catalyst to the silicon-based material solution, and adding a cross-linker to the silicon-based material solution. The silicon-based material includes at least one of: a siloxane, a silsesquioxane, a polysiloxane, a polysilsesquioxane, and a polysiloxane resin. The cross-linker includes a siloxane compound according to the general formula:

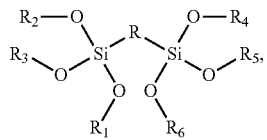

wherein R is an aliphatic comprising group and $R_1$, $R_2$, $R_3$, $R_4$, $R_5$, and $R_6$ are each independently selected from the group consisting of: H or an alkyl group with substituted or unsubstituted carbons. In some embodiments, the cross-linker includes at least one of: bis-(trimethoxysilylpropyl) amine, bis(triethoxysilyl) methane, 1,2-bis(triethoxysilyl) ethane, and 1-(triethoxysilyl)-2-(diethoxymethylsilyl) ethane. In some further embodiments, the cross-linker consists of bis-(trimethoxysilylpropyl) amine. In some embodiments, the silicon-based material includes a polysiloxane resin formed from monomers including at least one of: methyltrimethoxysilane, methyltriethoxysilane, dimethyldiethoxysilane, phenyl triethoxysilane, dimethyldimethoxysilane, and phenyl trimethoxysilane. In some further embodiments, the polysiloxane resin is formed from monomers consisting of methyltriethoxysilane, dimethyldiethoxysilane, and phenyl triethoxysilane. In some embodiments, the catalyst includes at least one of: tetramethylammonium acetate, tetramethylammonium hydroxide, tetrabutylammonium acetate, cetyltrimethylammonium acetate, and tetramethylammonium nitrate. In some embodiments, a concentration of the cross-linker is from 0.1 weight percent to 5 weight percent of the composition.

Various embodiments concern a planarizing film for a semiconductor device. The planarizing film includes a cured silicon-based polymer, a residue of a catalyst, and a residue of a cross-linker. The polymer includes at least one of: a polysiloxane, a polysilsesquioxane, and a polysiloxane resin. The residue of the cross-linker includes a residue of a siloxane compound according to the general formula:

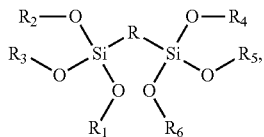

wherein R is an aliphatic comprising group and $R_1$, $R_2$, $R_3$, $R_4$, $R_5$, and $R_6$ are each independently selected from the group consisting of: H or an alkyl group with substituted or unsubstituted carbons. In some embodiments, the residue of the cross-linker includes a residue of at least one of: bis-(trimethoxysilylpropyl) amine, bis(triethoxysilyl) methane, 1,2-bis(triethoxysilyl) ethane, and 1-(triethoxysilyl)-2-(diethoxymethylsilyl) ethane. In some embodiments, the residue of the catalyst includes at least one of: tetramethylammonium acetate, tetramethylammonium hydroxide, tetrabutylammonium acetate, cetyltrimethylammonium acetate, and tetramethylammonium nitrate. In some embodiments, the planarizing film has a film thickness over a portion of the semiconductor device that is greater than 6 microns.

The above mentioned and other features of the invention, and the manner of attaining them, will become more apparent and the invention itself will be better understood by reference to the following description of embodiments of the invention taken in conjunction with the accompanying drawings.

DETAILED DESCRIPTION

Embodiments of the disclosure can employ a composition including a silicon-based material and a cross-linker described below for coating onto a surface of a semiconductor device, such as a microprocessor, a memory device, and a display employing light emitting diodes or other types of displays, to planarize the semiconductor device surface.

The coating can be applied, for example, by spin-coating or slot coating. Planarizing films formed by curing compositions according to embodiments of this disclosure have been found to exhibit excellent crack-resistance at thicknesses greater than 6 microns, even when subjected to temperatures in excess of 400° C. The planarizing films formed by curing compositions according to embodiments of this disclosure have also been found to exhibit high strength and high optical transmittance. The planarizing films formed by curing compositions according to embodiments of this disclosure have also been found to be thermally stable when exposed to temperatures exceeding 400° C.

Figure 1:
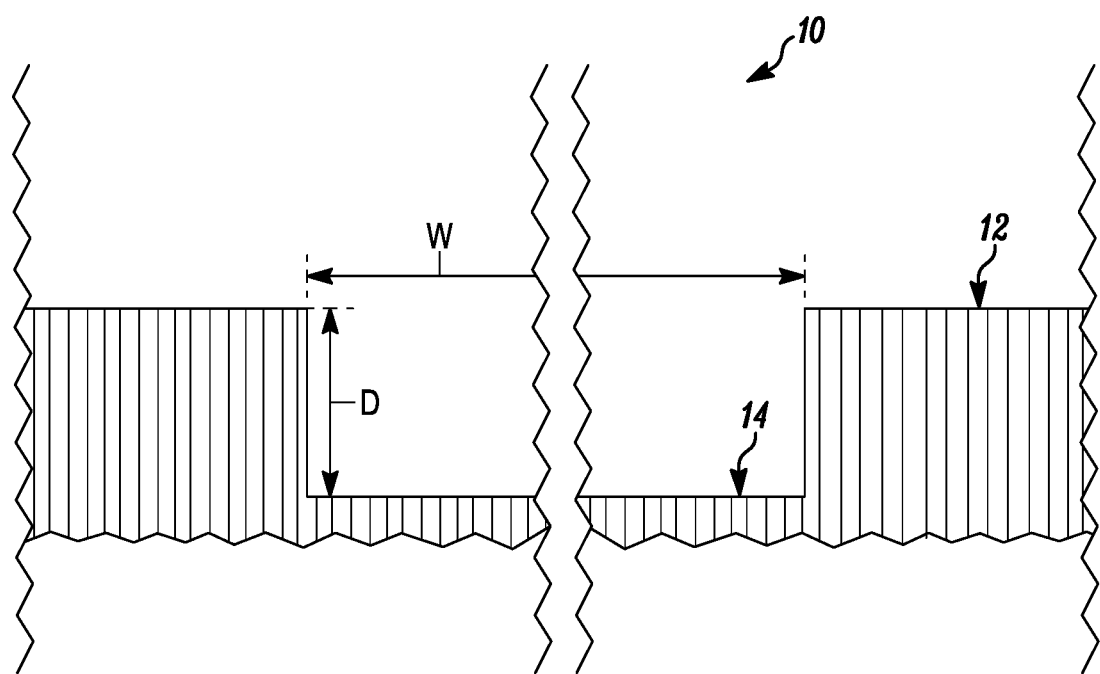
FIG. 1 is a schematic cross-section of a portion of a semiconductor device illustrating surface topography to be planarized.

FIG. 1 is a schematic cross-section of a portion of a semiconductor device illustrating surface topography to be planarized. FIG. 1 shows a semiconductor device 10 including a substrate 12 and at least one surface feature 14. The substrate 12 can include, for example, silicon, silicon dioxide, silicon nitride, aluminum, copper, or any other materials in various layers of various thicknesses and arrangements for the semiconductor device desired. In some embodiments, the surface feature 14 can be a trench formed into the substrate 12.

The surface feature 14 can be described as having a width W and a depth D. In some embodiments, the depth D of the surface feature 14 can be as small as 0.01 microns, 0.1 microns, 0.5 microns, or 1 micron, as large as 3 microns, 5 microns, 10 microns, 100 microns. In some embodiments, the depth D of the surface feature 14 can range from 0.01 microns to 100 microns, 0.1 microns to 10 microns, 0.5 microns to 5 microns, or 1 micron to 3 microns. In some embodiments, width W of the surface feature 14 can be as small as 0.01 microns, 0.1 microns, 1 micron, 10 microns, or as great as 50 microns, 100 microns, 500 microns, 1000 microns. In some embodiments, the width W of the surface feature 14 can range from 0.01 microns to 1000 microns, 0.1 microns to 500 microns, 1 micron to 100 microns, or 10 microns to 50 microns.

Figure 2:
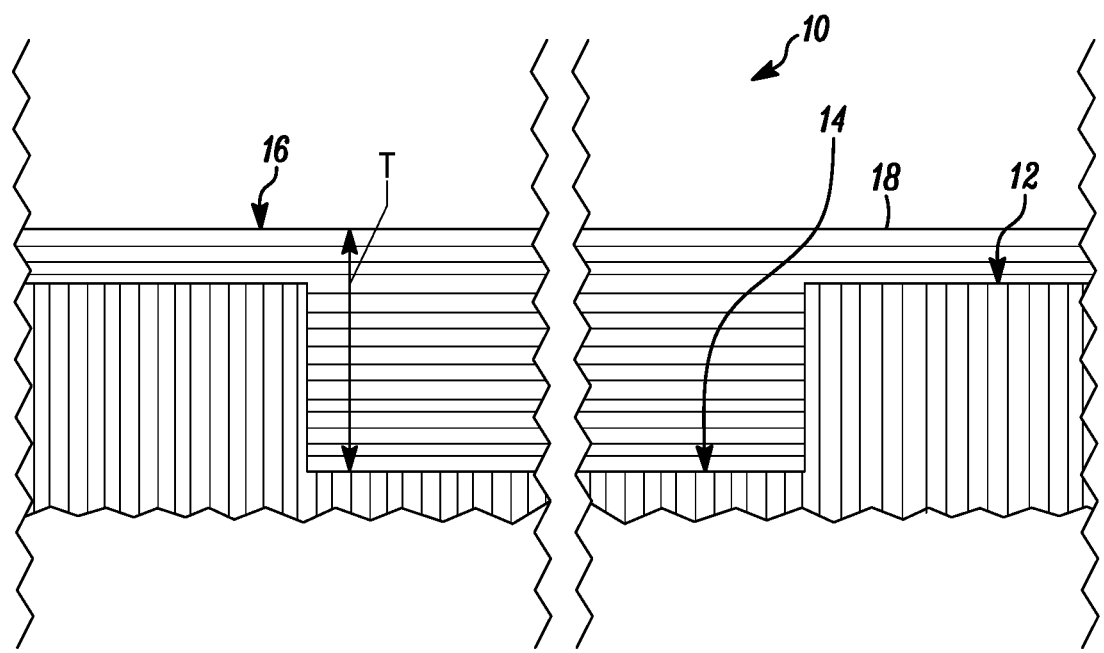
FIG. 2 is a schematic cross-section of the portion of the semiconductor device of FIG. 1 illustrating planarization of the surface topography by a planarization film according to embodiments of this disclosure.

FIG. 2 is a schematic cross-section of the portion of the semiconductor device 10 of FIG. 1 illustrating planarization of the surface feature 14 by a planarizing film 16 according to embodiments of this disclosure. FIG. 2 shows the semiconductor device 10 after formation of the planarizing film 16 from a silicon-based material and cross-linker composition according to embodiments of this disclosure. The planarizing film 16 can fill the surface feature 14 to provide a substantially planar surface 18 upon which subsequent devices layers (not shown) may be formed. In some embodiments, the planarizing film 16 can have a thickness T over a portion of the semiconductor device that is greater than 6 microns.

FIGS. 1 and 2 illustrate one example in which the planarizing film 16 according to embodiments of the disclosure may be formed. It is understood that the planarizing film 16 according to embodiments of the disclosure may be formed on many other topographies involving different arrangements of conductive, non-conductive, and semiconductive materials. For ease of illustration, only one surface feature 14 is shown in FIGS. 1 and 2. However it is understood that embodiments can include a plurality of surface features 14.

The planarizing film 16 can be formed by coating at least a portion of the semiconductor device 10 by, for example, spin coating or slot coating a composition including a silicon-based material, at least one solvent, a catalyst, and a cross-linker as described below. In some embodiments, the composition can further include a surfactant. In some embodiments, the composition consists essentially of a composition including a silicon-based material, at least one solvent, a catalyst, a surfactant, and a cross-linker as described below.

In some embodiments, the silicon-based material can include a siloxane, a silsesquioxane, a polysiloxane, or a polysilisesquioxane, or any combinations thereof. In some embodiments the silicon-based resin can include, for example, methylsiloxane, methylsilsesquioxane, phenylsiloxane, phenylsilsesquioxane, methylphenylsiloxane, methylphenylsilsesquioxane, dimethylsiloxane, diphenylsiloxane, methylphenylsiloxane, polyphenylsilsesquioxane, polyphenylsiloxane, polymethylphenylsiloxane, polymethylphenylsilsesquioxane, polymethylsiloxane, or polymethylsilsesquioxane, or any combinations thereof.

In some embodiments, the silicon-based material can additionally or alternatively include one or more polysiloxane resins, such as one or more of the Glass Resin polysiloxane resins available from Techneglas, Perrysburg, Ohio. In some embodiments, the polysiloxane resins are silicon-based oligomers formed from a limited hydrolysis and condensation reaction of one or more silicon-based monomers. In some embodiments, the silicon-based monomers can include organoalkoxysilanes having a Si—C bond, such as methyltrimethoxysilane (MTMOS), methyltriethoxysilane (MTEOS), dimethyldiethoxysilane (DMDEOS), phenyl triethoxysilane (PTEOS), dimethyldimethoxysilane, or phenyltrimethoxysilane or any combinations thereof. In some embodiments, the silicon-based monomers can include organoalkoxysilanes that lack an Si—C bond, such as tetraethylorthosilicate (TEOS).

In some embodiments, the concentration of the silicon-based material in the composition can be as low as 5 weight percent (wt. %), 10 wt. %, 20 wt. %, or 30 wt. % or as high as 40 wt. %, 50 wt. %, 60 wt. %, 70 wt. %, or 80 wt. % of the total weight of the composition, or within any range defined by any two of the preceding values, for example, in some embodiments, the concentration of the silicon-based material in the composition can range from 5 wt. % to 80 wt. %, 10 wt. % to 60 wt. %, or 20 wt. % to 40 wt. % of the total weight of the composition.

The at least one solvent can include a single solvent, such as a glycol ether, a glycol ether acetate, n-butyl acetate, a ketone, or an alcohol. Glycol ethers can include, for example, propylene glycol propyl ether or propylene glycol methyl ether. Glycol ether acetates can include, for example, propylene glycol methyl ether acetate (PGMEA), 2-ethoxyethyl acetate, or 2-methoxyethyl acetate. Ketones can include, for example, acetone or diethyl ketone. Alcohols can include, for example, isopropyl alcohol, butanol, or ethanol. In other embodiments, the at least one solvent includes a mixture two or more of the foregoing solvents.

The cross-linker includes a siloxane compound according to the general formula: Formula I:

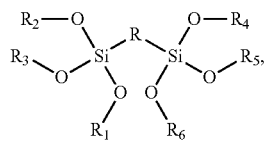

wherein R is an aliphatic comprising group and $R_1$, $R_2$, $R_3$, $R_4$, $R_5$, and $R_6$ are each independently selected from the group consisting of: H or an alkyl group with substituted or unsubstituted carbons. In some embodiments, R is an aliphatic group.

For example, in some embodiments, the cross-linker can be bis-(trimethoxysilylpropyl) amine, bis(triethoxysilyl) methane, 1,2-bis(triethoxysilyl) ethane, or 1-(triethoxysilyl)-2-(diethoxymethylsilyl) ethane, or any combinations thereof. Such cross-linkers have high functionality to provide a greater chance of linking together high molecular weight chains, as well as low molecular weight oligomers. Without wishing to be bound by any theories, it is believed that without cross-linkers as described above, high molecular weight chains cross-link directly, producing rigid structures that build up high stresses after high temperature exposure. It is further believed that insufficiently bonded low-molecular weight oligomers make the coatings weaker and more likely to crack due to the build-up of high stresses in the film. The high functionality cross-linkers bond together the high molecular weight chains at more locations to provide extra strength, while the aliphatic comprising group of the cross-linkers provides flexibility between the chains to reduce film stress. The high functionality cross-linkers also bond to more of the low-molecular weight oligomers, acting as chain extenders to increase the molecular weight of the film and increase the film strength. Thus, planarizing films according to embodiments of this disclosure are able to resist cracking, even at thickness exceeding 6 microns and after exposure to temperatures exceeding 400° C.

In some embodiments, the concentration of the cross-linker in the composition can be as low as 0.01 wt. %, 0.1 wt. %, 0.4 wt. %, 0.6 wt. %, or 0.8 wt. %, or as high as 1 wt. %, 2 wt. %, 3 wt. %, 4 wt. %, or 5 wt. % of the total weight of the composition, or within any range defined by any two of the preceding values, for example, in some embodiments, the concentration of the cross-linker in the composition can range from 0.01 wt. % to 5 wt. %, 0.1 wt. % to 4 wt. %, 0.4 wt. % to 3 wt. %, 0.6 wt. % to 2 wt. %, 0.8 wt. % to 1 wt. %, or 0.4 wt. % to 0.8 wt. % of the total weight of the composition.

The catalyst can include, for example, tetramethylammonium acetate (TMAA), tetramethylammonium hydroxide (TMAH), tetrabutylammonium acetate (TBAA), cetyltrimethylammonium acetate (CTAA), tetramethylammonium nitrate (TMAN), triphenylamine, trioctylamine, tridodecylamine, triethanolamine, tetramethylphosphonium acetate, tetramethylphosphonium hydroxide, triphenylphosphine, trimethylphosphine, trioctylphosphine, aminopropyltriethoxysilane, aminopropyltriethoxysilane triflate, and any combinations thereof. Such catalysts can be activated by heat after the composition is applied to the semiconductor device 10 to cause polymerization and cross-linking of the composition to form the planarizing film 16.

In some embodiments, the composition can further include a surfactant. It has been found that a surfactant can further reduce striations, which may be particularly useful when the composition is spin-coated onto larger diameter semiconductor device wafers or display substrates. In some embodiments, the surfactant can be a polyether-modified polydimethylsiloxane surfactant, such a BYK®-306 or BYK®-307 available from BYK-Chemie, Wesel, Germany.

In some embodiments, the concentration of the surfactant in the composition can be as low as 0.01 wt. %, 0.1 wt. %, 0.4 wt. %, 0.6 wt. %, or 0.8 wt. %, or as high as 1 wt. %, 5 wt. %, 10 wt. %, 15 wt. %, or 20 wt. % of the total weight of the composition, or within any range defined by any two of the preceding values, for example, in some embodiments, the concentration of the surfactant in the composition can range from 0.01 wt. % to 20 wt. %, 0.1 wt. % to 15 wt. %, 0.4 wt. % to 10 wt. %, 0.6 wt. % to 5 wt. %, or 0.8 wt. % to 1 wt. % of the total weight of the composition.

In some embodiments, the composition can further include an organic acid which can volatilize or decompose at high temperatures to help stabilize the composition. In some embodiments, the organic acid can include trifluoroacetic acid, p-toluenesulfonic acid, citric acid, formic acid, or acetic acid, or any combinations thereof. In some embodiments, the concentration of the organic acid can include as little as 0.1 wt. %, 0.2 wt. %, 0.3 wt. %, or 0.4 wt. %, or as much as 0.5 wt. %, 0.6 wt. %, 0.8 wt. %, or 1 wt. % of the total weight of the composition, or within any range defined by any two of the preceding values, for example, in some embodiments, the concentration of the organic acid in the composition can range from 0.1 wt. % to 1 wt. %, 0.2 wt. % to 0.8 wt. %, 0.3 wt. % to 0.6 wt. %, or 0.4 wt. % to 0.5 wt. % of the total weight of the composition.

A method for making a planarizing composition in accordance with embodiments of this disclosure can include providing a silicon-based material as described above and dissolving the silicon-based material in the one or more solvents to form a silicon-based material solution. Dissolving the silicon-based material can be encouraged by mixing the silicon-based material into the one or more solvents for one to four hours. A cross-linker as described above and a catalyst as described above can be added to the silicon-based material solution. The silicon-based material solution can be stirred for several more hours, for example, three hours to form the composition. The composition may then be filtered through a 0.1 micron filter.

In use, a planarizing composition in accordance with embodiments of this disclosure can be applied to the semiconductor device 10 (FIG. 1) by, for example spin coating. The coated device 10 can then be bake at a temperature ranging from about 160° C. to about 180° C. to drive off substantially all of the at least one solvent and form an uncured film. Once the at least one solvent is substantially driven off, the catalyst can be activated by heat to cure the film by polymerizing and cross-linking the silicon-based materials and the cross-linker to form the planarizing film 16. Residues of the cross-linker and the catalyst can remain after curing.

In some embodiments, the planarizing film 16 can be cured at a temperature as low as 250° C., 260° C., 280° C., 300° C., or 350° C., or as high as 400° C., 410° C., 420° C., 430° C., 440° C., or 450° C., or at any temperature between any two of the preceding temperatures. For example, in some embodiments, the planarizing film 16 can be cured a temperature ranging from 250° C. to 450° C., 260° C. to 440° C., 280° C. to 430° C., 300° C. to 420° C., or 350° C. to 410° C.

In some embodiments, the planarizing film 18 can further include a surfactant residue, according to any of the embodiments described above, including a residue of a polyether-modified polydimethylsiloxane surfactant, such a BYK®-307.

While this invention has been described as relative to exemplary designs, the present invention may be further modified within the spirit and scope of this disclosure. Further, this application is intended to cover such departures from the present disclosure as come within known or customary practice in the art to which this invention pertains.

EXAMPLES

Comparative Example—PTSRE50C Planarizinq Composition

PTSRE50C is a planarizing composition obtained from Honeywell Electronic Materials, Santa Clara, Calif. PTSRE50C is a is planarizing composition including a poly(silsesquioxane) resin including a 3:1 molar ratio of poly(methylsilsesquioxane) blocks to poly(phenylsilsesquioxane) blocks with about 0.15 mole % of poly(dimethylsiloxane) blocks and including a catalyst and a surfactant.

The filtered planarizing composition was coated onto three, four-inch silicon wafers by spin coating, two at 1,000 RPM and one at 720 RPM. The wafers with the cast films were baked on a series of two hot plates in air ambient for 60 seconds each, a first hot plate having a surface temperature of 160° C. and a second hot plate having a surface temperature of 180° C., to evaporate the solvents. Each of the wafers received a second coating, each spun at same speed as for their first coating and baked again on the hot plates as described above. One of the two wafers coated at 1,000 RPM and the wafer coated at 720 RPM each received a third coating, each spun at same speed as for their first coating and baked again on the hot plates as described above. A thickness of the baked coating was measured for each of the wafers and found to be 34,368 Å for the double coating at 1,000 RPM, 52,646 Å for the triple coating at 1,000 RPM, and 63,992 Å for the triple coating at 720 RPM. The three wafers with the baked coatings were cured in a nitrogen ambient at 410° C. for 30 minutes. The cured coatings were inspected for cracking by optical microscopy and scanning electron microscopy. No cracking of the cured coating was observed on the wafer with the thinnest coating. Cracking was observed on the other two wafers having the thicker coatings.

Example 1—GR150F/GR950F Planarizinq Composition

In a 200 ml flask, 10 g of BYK®-307 surfactant obtained from BK-Chemie was added to 90 g of ethanol and stirred for 1 hour at room temperature to prepare a 10 wt. % surfactant solution. In another 200 ml flask, 0.5 g of tetrabutylammonium nitrate (TBAA) catalyst was added to 24.5 g of deionized water and stirred for 1 hour at room temperature, after which 0.305 g of trifluoroacetic acid was added and the mixture stirred for another hour to prepare a 2 wt. % TBAA catalyst solution. In another 200 ml flask, 11.4 g of trifluoroacetic acid and 34.15 g of Silquest® A-1170 (bis-(trimethoxysilylpropyl) amine) cross-linker obtained from Momentive Performance Materials, Waterford, N.Y. were added to 54.4 g of PGMEA and stirred for 1 hour at room temperature to prepare a cross-linker solution. In another 200 ml flask, 45.0 g of GR150F resin obtained from Techneglas of Perrysburg, Ohio was added to 55.0 g of PGMEA and stirred for 1 hour at room temperature to form a GR150F resin solution. GR150 is a poly(silsesquioxane) resin including equimolar amounts of poly(methylsilsesquioxane) blocks and poly(phenylsilsesquioxane) blocks with about 0.3 mole % of poly(dimethylsiloxane) blocks. In another 200 ml flask, 50.0 g of GR950F resin obtained from Techneglas of Perrysburg, Ohio was added to 45.0 g of PGMEA and stirred for 1 hour at room temperature to form a GR950F resin solution. GR950F is a poly(phenylsilsesquioxane) resin. In another 200 ml flask, 1.48 g of the 10 wt. % surfactant solution, 2.25 g of the TBAA catalyst solution, and 0.45 g of the cross-linker solution were added to 50 g of the GR150F solution and 45 g of the GR950F solution along with 20 g of PGMEA and stirred for 3 hours at room temperature to form a planarizing composition. The planarizing composition was filtered through a 0.1 micron filter.

The filtered planarizing composition was coated on a four-inch silicon wafer by spin coating at 1,500 revolutions per minute (RPM). The wafer with the cast film was baked on a series of two hot plates in air ambient for 60 seconds each, a first hot plate having a surface temperature of 160° C. and a second hot plate having a surface temperature of 180° C., to evaporate the solvents. A uniform coating was obtained.

Example 2—GR650F Planarizing Composition

In a 100 ml flask, 0.5 g of tetramethylammonium nitrate (TMAN) catalyst was added to 24.5 g of deionized water and stirred for 1 hour at room temperature to prepare a 2 wt. % TMAN catalyst solution. In another 200 ml flask, 45.0 g of GR650F resin obtained from Techneglas of Perrysburg, Ohio was added to 55.0 g of PGMEA and stirred for 1 hour at room temperature to form a GR650F resin solution. GR650F is a poly(methylsilsesquioxane) resin. In another 200 ml flask, 0.25 g of the 10 wt. % surfactant solution prepared as described above, 0.023 g of the TMAN catalyst solution, and 0.45 g of the cross-linker solution prepared as described above were added to 20 g of the GR650F resin solution and stirred for 3 hours at room temperature to form a planarizing composition. The planarizing composition was filtered through a 0.1 micron filter.

The filtered planarizing composition was coated on a four-inch silicon wafer by spin coating at 1,500 RPM. The wafer with the cast film was baked on a series of two hot plates in air ambient for 60 seconds each, a first hot plate having a surface temperature of 160° C. and a second hot plate having a surface temperature of 180° C., to evaporate the solvents. A uniform coating was obtained.

Example 3—PTSRE50C Planarizinq Composition

In a 50 ml flask, 0.06 g of Silquest® A-1170 (bis-(trimethoxysilylpropyl) amine) cross-linker was added to 20 g of PTSRE50C and stirred for 1 hour at room temperature to form a planarizing composition. The planarizing composition was filtered through a 0.1 micron filter.

The filtered planarizing composition was coated on a four-inch silicon wafer by spin coating at 1,000 RPM. The wafer with the cast film was baked on a series of two hot plates in air ambient for 60 seconds each, a first hot plate having a surface temperature of 160° C. and a second hot plate having a surface temperature of 180° C., to evaporate the solvents. A thickness of the baked coating was measured and found to be 40,164 Å. The wafer with the baked coating was cured in a nitrogen ambient at 410° C. for 30 minutes. The cured coating was inspected for cracking by optical microscopy and scanning electron microscopy. No cracking of the cured coating was observed.

Example 4—PTSRE50C Planarizing Composition

In a 200 ml flask, 34.15 g of Silquest® A-1170 (bis-(trimethoxysilylpropyl) amine) cross-linker was added 11.4 g of trifluoroacetic acid and 54.5 g of PGMEA and stirred for 1 hour at room temperature to form a cross-linker solution. In a 100 ml flask, 0.6 g of the cross-linker solution was added to 20 g of PTSRE50C and stirred for 1 hour at room temperature to form a planarizing composition. The planarizing composition was filtered through a 0.1 micron filter.

The filtered planarizing composition was coated onto three, four-inch silicon wafers by spin coating, two at 1,500 RPM and one at 1,000 RPM. The wafers with the cast films were baked on a series of two hot plates in air ambient for 60 seconds each, a first hot plate having a surface temperature of 160° C. and a second hot plate having a surface temperature of 180° C., to evaporate the solvents. One of the two wafers coated at 1,500 RPM and the wafer coated at 1,000 RPM each received a second coating, each spun at same speed as for their first coating and baked again on the hot plates as described above. A thickness of the baked coating was measured for each of the wafers and found to be 14,100 Å for the single coating at 1,500 RPM, 27,723 Å for the double coating at 1,500 RPM, and 34,451 Å for the double coating at 1,000 RPM. The three wafers with the baked coatings were cured in a nitrogen ambient at 410° C. for 30 minutes. The cured coatings were inspected for cracking by optical microscopy and scanning electron microscopy. No cracking of the cured coating was observed on any of the wafers.

Example 5—PTSRE50C Planarizing Composition

In a 100 ml flask, 0.06 g of Silquest® A-1170 (bis-(trimethoxysilylpropyl) amine) cross-linker and 11.4 g of trifluoroacetic acid was added to 20 g of PTSRE50C and stirred for 1 hour at room temperature to form a planarizing composition. The planarizing composition was filtered through a 0.1 micron filter.

The filtered planarizing composition was coated on two, four-inch silicon wafers by spin coating at 1,000 RPM. The wafers with the cast film were baked on a series of two hot plates in air ambient for 60 seconds each, a first hot plate having a surface temperature of 160° C. and a second hot plate having a surface temperature of 180° C., to evaporate the solvents. One of the wafers was cured in a nitrogen ambient at 410° C. for 30 minutes and the other cured in a nitrogen ambient at 410° C. for 24 hours. A thickness of the baked coating was measured for each wafer and found to be 31,740 Å for the wafer cured for 30 minutes and 31,456 Å for the wafer cured for 24 hours. The cured coatings were inspected for cracking by optical microscopy and scanning electron microscopy. No cracking of the cured coating was observed on the wafer cured for 30 minutes. Cracking was observed on the wafer cured for 24 hours.

Example 6—PTSRE50C Planarizinq Composition

In a 100 ml flask, 0.06 g of 1,4-bis-(triethoxysilyl) methane cross-linker was added to 30 g of PTSRE50C and stirred for 1 hour at room temperature to form a planarizing composition. The planarizing composition was filtered through a 0.1 micron filter.

The filtered planarizing composition was coated onto three, four-inch silicon wafers by spin coating at 1,300 RPM. The wafers with the cast films were baked on a series of two hot plates in air ambient for 60 seconds each, a first hot plate having a surface temperature of 160° C. and a second hot plate having a surface temperature of 180° C., to evaporate the solvents. Each of the four wafers received a second coating and hot plate bake as described above. Three of the wafers each received a third coating and hot plate bake as described above. Two of the three wafers with the third coating received a fourth coating and hot plate bake as described above. One of the two wafers with the fourth coating received a fifth coating and hot plate bake as described above. A thickness of the baked coating was measured for each of the wafers and found to be 29,863 Å for the double coating, 45,855 Å for the triple coating, 61,995 Å for the quadruple coating, and 82,229 Å for the quintuple coating. The four wafers with the baked coatings were cured in a nitrogen ambient at 410° C. for 30 minutes. The cured coatings were inspected for cracking by optical microscopy and scanning electron microscopy. No cracking of the cured coating was observed on wafers with the double, triple, or quadruple coating. Cracking of the cured coating was observed on the wafer with the quintuple coating.

Example 7—PTSRE50C Planarizing Composition

In a 100 ml flask, 0.12 g of 1,4-bis-(triethoxysilyl) methane cross-linker was added to 30 g of PTSRE50C and stirred for 1 hour at room temperature to form a planarizing composition. The planarizing composition was filtered through a 0.1 micron filter.

The filtered planarizing composition was coated onto three, four-inch silicon wafers by spin coating at 1,300 RPM. The wafers with the cast films were baked on a series of two hot plates in air ambient for 60 seconds each, a first hot plate having a surface temperature of 160° C. and a second hot plate having a surface temperature of 180° C., to evaporate the solvents. Each of the four wafers received a second coating and hot plate bake as described above. Three of the wafers each received a third coating and hot plate bake as described above. Two of the three wafers with the third coating received a fourth coating and hot plate bake as described above. One of the two wafers with the fourth coating received a fifth coating and hot plate bake as described above. A thickness of the baked coating was measured for each of the wafers and found to be 29,863 Å for the double coating, 45,855 Å for the triple coating, 61,995 Å for the quadruple coating, and 82,229 Å for the quintuple coating. The four wafers with the baked coatings were cured in a nitrogen ambient at 410° C. for 30 minutes. The cured coatings were inspected for cracking by optical microscopy and scanning electron microscopy. No cracking of the cured coating was observed on wafers with the double, triple, or quadruple coating. Cracking of the cured coating was observed on the wafer with the quintuple coating.

Example 8—PTSRE50C Planarizinq Composition

In a 100 ml flask, 0.30 g of 1,4-bis-(triethoxysilyl) methane cross-linker was added to 30 g of PTSRE50C and stirred for 1 hour at room temperature to form a planarizing composition. The planarizing composition was filtered through a 0.1 micron filter.

The filtered planarizing composition was coated onto three, four-inch silicon wafers by spin coating at 1,300 RPM. The wafers with the cast films were baked on a series of two hot plates in air ambient for 60 seconds each, a first hot plate having a surface temperature of 160° C. and a second hot plate having a surface temperature of 180° C., to evaporate the solvents. Each of the four wafers received a second coating and hot plate bake as described above. Three of the wafers each received a third coating and hot plate bake as described above. Two of the three wafers with the third coating received a fourth coating and hot plate bake as described above. One of the two wafers with the fourth coating received a fifth coating and hot plate bake as described above. A thickness of the baked coating was measured for each of the wafers and found to be 29,443 Å for the double coating, 44,628 Å for the triple coating, 59,910 Å for the quadruple coating, and 80,674 Å for the quintuple coating. The four wafers with the baked coatings were cured in a nitrogen ambient at 410° C. for 30 minutes. The cured coatings were inspected for cracking by optical microscopy and scanning electron microscopy. No cracking of the cured coating was observed on wafers with the double, triple, or quadruple coating. Cracking of the cured coating was observed on the wafer with the quintuple coating.

What is claimed is:

1. A composition for planarizing a surface of a semiconductor device, the composition comprising:
    a silicon-based material including a polysiloxane resin, the polysiloxane resin formed from monomers consisting of methyltriethoxysilane, dimethyldiethoxysilane, and phenyl triethoxysilane;
    at least one solvent;
    a catalyst; and
    a cross-linker including a siloxane compound according to the general formula:

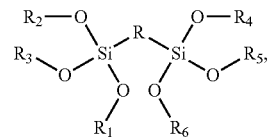

wherein R is an aliphatic comprising group and $R_1$, $R_2$, $R_3$, $R_4$, $R_5$, and $R_6$ are each independently selected from the group consisting of: H or an alkyl group with substituted or unsubstituted carbons.

2. The composition of claim 1, wherein the cross-linker includes at least one of: bis-(trimethoxysilylpropyl) amine, bis(triethoxysilyl) methane, 1,2-bis(triethoxysilyl) ethane and 1-(triethoxysilyl)-2-(diethoxymethylsilyl) ethane.

3. The composition of claim 2, wherein the cross-linker consists of bis-(trimethoxysilylpropyl) amine.

4. The composition of claim 1, wherein a concentration of the cross-linker is from 0.01 weight percent to 5 weight percent of the composition.

5. The composition of claim 1, wherein the at least one solvent includes at least one of: ethyl lactate, propylene glycol propyl ether, propylene glycol monomethyl ether acetate, ethanol, isopropyl alcohol, and n-butyl acetate.

6. The composition of claim 1, wherein the catalyst includes at least one of: tetramethylammonium acetate, tetramethylammonium hydroxide, tetrabutylammonium acetate, cetyltrimethylammonium acetate, and tetramethylammonium nitrate.

7. The composition of claim 1, further including a surfactant.

8. A method for making a planarizing composition, the method comprising:
    dissolving a silicon-based material in one or more solvents to form a silicon-based material solution, the silicon-based material including a polysiloxane resin, the polysiloxane resin formed from monomers consisting of methyltriethoxysilane, dimethyldiethoxysilane, and phenyl triethoxysilane;
    adding a catalyst to the silicon-based material solution; and
    adding a cross-linker to the silicon-based material solution, the cross-linker includes a siloxane compound according to the general formula:

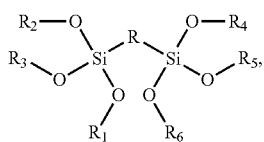

wherein R is an aliphatic comprising group and $R_1$, $R_2$, $R_3$, $R_4$, $R_5$, and $R_6$ are each independently selected from the group consisting of: H or an alkyl group with substituted or unsubstituted carbons.

9. The method of claim 8, wherein the cross-linker includes at least one of: bis-(trimethoxysilylpropyl) amine, bis(triethoxysilyl) methane, 1,2-bis(triethoxysilyl) ethane, and 1-(triethoxysilyl)-2-(diethoxymethylsilyl) ethane.

10. The method of claim 9, wherein the cross-linker consists of bis-(trimethoxysilylpropyl) amine.

11. The method of claim 8, wherein the catalyst includes at least one of: tetramethylammonium acetate, tetramethylammonium hydroxide, tetrabutylammonium acetate, cetyltrimethylammonium acetate, and tetramethylammonium nitrate.

12. The method of claim 8, wherein a concentration of the cross-linker is from 0.01 weight percent to 5 weight percent of the composition.

13. A planarizing film for a semiconductor device, the film comprising:
a cured silicon-based polymer including a polysiloxane resin, the polysiloxane resin formed from monomers consisting of methyltriethoxysilane, dimethyldiethoxysilane, and phenyl triethoxysilane;
a residue of a catalyst; and
a residue of a cross-linker, the residue of the cross-linker including a residue of a siloxane compound according to the general formula:

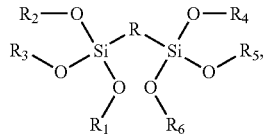

wherein R is an aliphatic comprising group and $R_1$, $R_2$, $R_3$, $R_4$, $R_5$, and $R_6$ are each independently selected from the group consisting of: H or an alkyl group with substituted or unsubstituted carbons.

14. The planarizing film of claim 13, wherein the residue of the cross-linker includes a residue of at least one of: bis-(trimethoxysilylpropyl) amine, bis(triethoxysilyl) methane, 1,2-bis(triethoxysilyl) ethane, and 1-(triethoxysilyl)-2-(diethoxymethylsilyl) ethane.

15. The planarizing film of claim 13, wherein the residue of the catalyst includes at least one of: tetramethylammonium acetate, tetramethylammonium hydroxide, tetrabutylammonium acetate, cetyltrimethylammonium acetate, and tetramethylammonium nitrate.

16. The planarizing film of claim 13, wherein the planarizing film has a film thickness over a portion of the semiconductor device that is greater than 3 microns.

* * * * *